United States Patent
Chen

(10) Patent No.: US 11,014,215 B2
(45) Date of Patent: May 25, 2021

(54) CHEMICAL MECHANICAL POLISHING PROCESS

(71) Applicant: Winbond Electronics Corp., Taichung (TW)

(72) Inventor: Yi-Chung Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/586,910

(22) Filed: Sep. 28, 2019

(65) Prior Publication Data

US 2021/0094145 A1    Apr. 1, 2021

(51) Int. Cl.
*H01L 21/321* (2006.01)
*H01L 21/3105* (2006.01)
*C09K 13/02* (2006.01)
*C09K 13/00* (2006.01)
*C09G 1/02* (2006.01)
*B24B 37/24* (2012.01)

(52) U.S. Cl.
CPC ............... *B24B 37/24* (2013.01); *C09G 1/02* (2013.01); *C09K 13/00* (2013.01); *C09K 13/02* (2013.01); *H01L 21/31053* (2013.01); *H01L 21/3212* (2013.01)

(58) Field of Classification Search
None
See application file for complete search history.

(56) References Cited

U.S. PATENT DOCUMENTS

2005/0148289 A1 *    7/2005    Mikolas ............... B24B 37/042
                                                      451/41
2006/0199473 A1 *    9/2006    Suzuki ............... B24D 18/0027
                                                      451/8

* cited by examiner

*Primary Examiner* — Stephanie P Duclair
(74) *Attorney, Agent, or Firm* — JCIPRNET

(57) ABSTRACT

Provided is a chemical mechanical polishing process. The process includes the following steps: a layer to be polished is provided, wherein the layer to be polished has a hole, a trench and/or an opening formed therein, and a protrusion is formed at the corner of the top of the hole, the trench and/or the opening; a polishing pad with a plurality of fibers on the surface thereof is provided; and in a moving direction perpendicular to the top surface of the layer to be polished, the plurality of fibers of the polishing pad are intermittently contacted with the protrusion in the presence of an abrasive-free slurry.

5 Claims, 3 Drawing Sheets

CHEMICAL MECHANICAL POLISHING PROCESS

BACKGROUND OF THE INVENTION

1. Field of the Invention

The present invention relates to a semiconductor process, and particularly relates to a chemical mechanical polishing (CMP) process.

2. Description of Related Art

In a general semiconductor process, after a hole, a trench or an opening is formed, an etching process is usually performed to adjust the profile of the formed hole, trench or opening. In detail, after the hole, the trench or the opening is formed, a protrusion is usually formed at the corner of the top of the formed hole, trench or opening, so that the width of the top of the hole, the trench or the opening is reduced. Thus, in subsequent processes, after a material is filled into the hole, the trench or the opening, the material cannot completely fill the hole, the trench or the opening so as to form voids therein. In order to solve the above problem, after the hole, the trench or the opening is formed, an anisotropic etching process is performed, and the protrusion is removed by an ion bombardment.

However, when the protrusion is removed using the above method, the material at and around the corner of the top of the hole, the trench or the opening is greatly removed simultaneously, so that the profile of the hole, the trench or the opening is greatly changed. Furthermore, when the protrusion is removed using the above method, the substrate exposed from the hole, the trench or the opening is partially removed simultaneously, so that the depth and profile of the hole, the trench or the opening are changed.

SUMMARY OF THE INVENTION

The present invention is directed to a chemical mechanical polishing process which can remove the protrusion formed at the corner of the top of the hole, the trench or the opening without greatly changing the depth and profile of the hole, the trench or the opening.

The chemical mechanical polishing process of the present invention includes the following steps: a layer to be polished is provided, wherein the layer to be polished has a hole, a trench and/or an opening formed therein, and a protrusion is formed at the corner of the top of the hole, the trench and/or the opening; a polishing pad with a plurality of fibers on the surface thereof is provided; and in a moving direction perpendicular to the top surface of the layer to be polished, the plurality of fibers of the polishing pad are intermittently contacted with the protrusion in the presence of an abrasive-free slurry.

Based on the above, in the present invention, in the moving direction perpendicular to the top surface of the layer to be polished, the layer to be polished is polished by using the polishing pad with fibers in the presence of the abrasive-free slurry. Therefore, the fibers can enter the hole, the trench and/or the opening to effectively remove the protrusion formed at the corner of the top of the hole, the trench and/or the opening, the thickness of the layer to be polished cannot be greatly reduced, and the depth and profile of the hole, the trench and/or the opening cannot be changed.

In order to make the aforementioned characteristic and advantage of the present invention more comprehensible, embodiments are further described in detail hereinafter in reference to accompanying drawings.

DESCRIPTION OF THE EMBODIMENTS

The following makes detailed description by listing embodiments and with reference to accompanying drawings, but the provided embodiments are not intended to limit the scope covered by the present invention. In addition, the drawings are drawn only for the purpose of description, and are not drawn according to original sizes. For ease of understanding, same elements in the following description are described by using same signs.

Terms such as "includes", "comprises", and "having" used herein are all inclusive terms, namely, mean "includes but not limited to". Further, directional terms mentioned herein such as "upper" and "lower" are intended to only indicate directions in reference drawings, but are not intended to limit the present invention.

Numbers and shapes mentioned in the following embodiments are intended to only specifically describe the present invention for ease of understanding content thereof, but are not intended to limit the present invention.

Figure 1A:
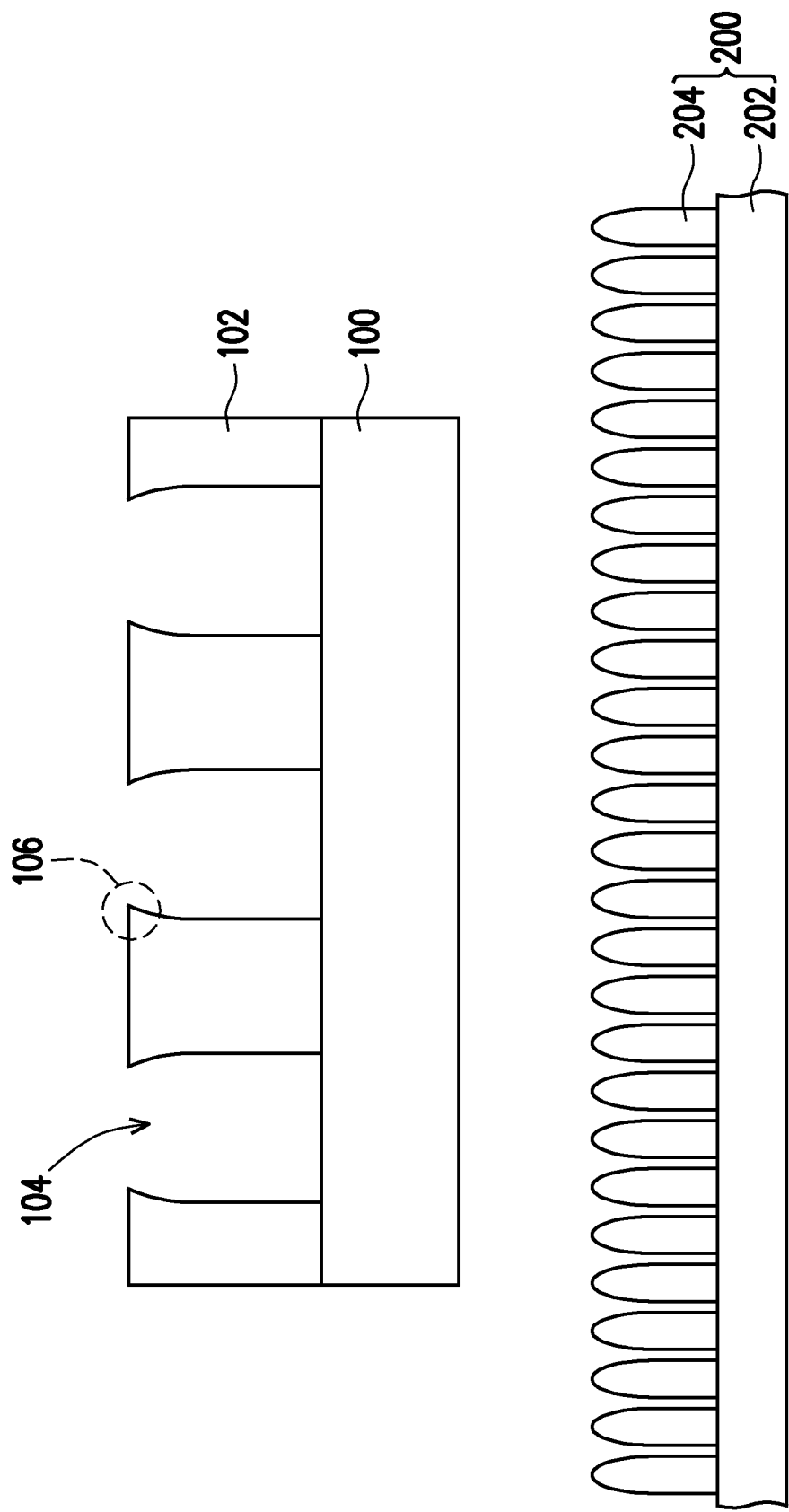
FIG. 1A to FIG. 1C are cross-sectional schematic views of flows of a chemical mechanical polishing process according to an embodiment of the present invention.
Figure 1B:
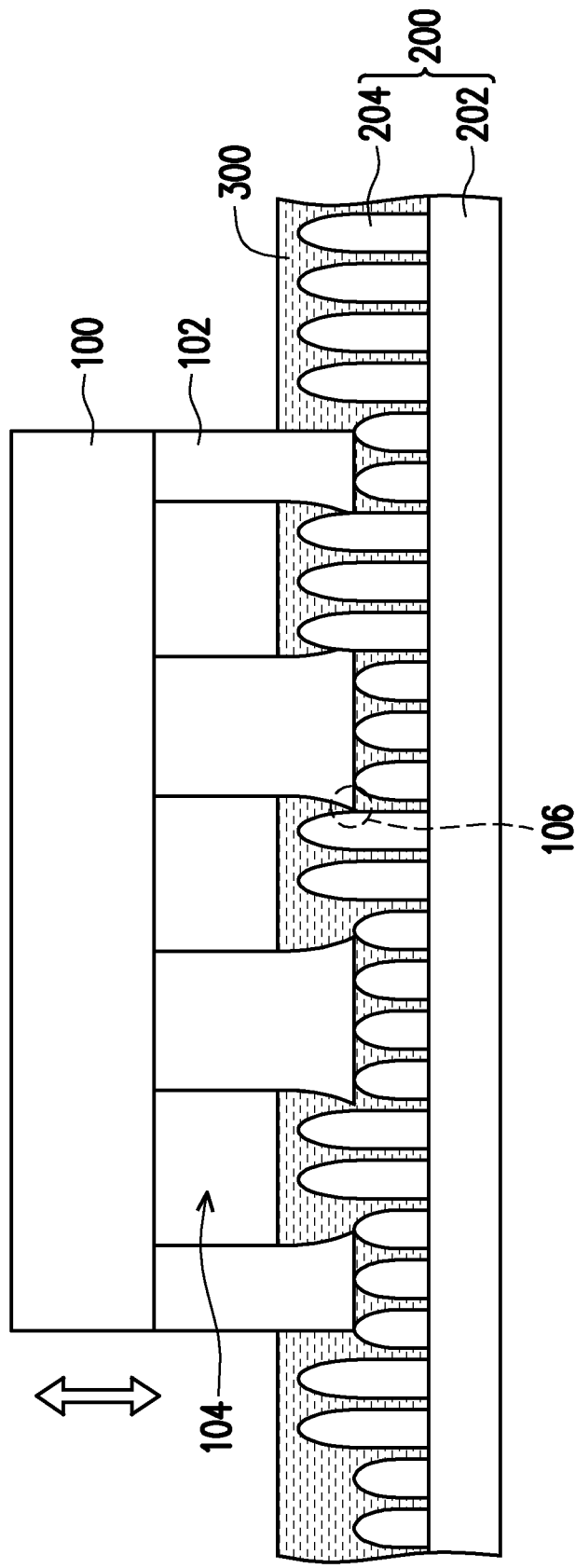
Figure 1C:
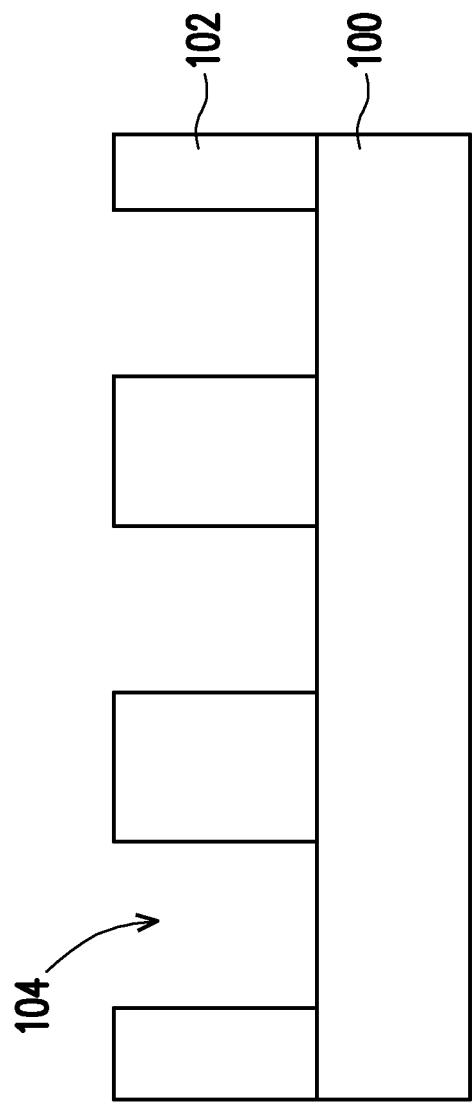

FIG. 1A to FIG. 1C are cross-sectional schematic views of flows of a chemical mechanical polishing process according to an embodiment of the present invention. Referring to FIG. 1A, a layer to be polished 102 is provided. In the present embodiment, the layer to be polished 102 is a dielectric layer formed on a substrate 100, and the substrate 100 can be a silicon substrate, a silicon-on-insulator (SOI) substrate, or any other type of substrate, but the present invention is not limited thereto. In other embodiments, the layer to be polished can also be a conductive layer. For example, in an embodiment, the layer to be polished can be a polycrystalline silicon layer conformally formed on the substrate and used for manufacturing a floating gate.

The layer to be polished 102 has a hole, a trench and/or an opening 104 formed therein. The hole, the trench and/or the opening 104 can be formed through any known patterning process, which is not otherwise described herein. Generally, after the hole, the trench and/or the opening 104 is formed by the above patterning process, a protrusion 106 is inevitably formed at the corner of the top of the hole, the trench and/or the opening 104. The protrusion 106 may cause the width of top of the hole, the trench and/or the opening 104 104 to be reduced. Thus, in subsequent processes, after a material is filled into the hole, the trench and/or the opening 104, the material cannot completely fill the hole, the trench and/or the opening 104 so as to form voids therein. Therefore, in subsequent processes, the protrusion 106 formed at the corner of the top of the hole, the trench and/or the opening 104 needs to be removed.

Furthermore, a polishing pad 200 is provided for performing chemical mechanical polishing on the layer to be polished 102. The polishing pad 200 includes a body 202 and a plurality of fibers 204. The fibers 204 are formed on the surface of the body 202. The fibers 204 are used for polishing the layer to be polished 102. In the present embodiment, the diameter of each fiber 204 must be less than the width of the hole, the trench and/or the opening 104. Preferably, the diameter of each fiber 204 does not exceed a half of the width of the hole, the trench and/or the opening 104. When the diameter of each fiber 204 exceeds a half of the width of the hole, the trench and/or the opening 104, in a polishing process, the fibers 204 cannot easily enter the hole, the trench and/or the opening 104 and cannot be effectively polished. Furthermore, in the present embodiment, the length of each fiber 204 is limited by being not in contact with the substrate 100 exposed from the hole, the trench and/or the opening 104 in the polishing process. Preferably, the length of each fiber 204 does not exceed 90% of the depth of the hole, the trench and/or the opening 104. When the length of each fiber 204 exceeds 90% of the depth of the hole, the trench and/or the opening 104, in the polishing process, the fibers 204 are used for not only polishing the layer to be polished 102 but also polishing the substrate 100 exposed from the hole, the trench and/or the opening 104. Therefore, the substrate 100 is damaged, and the depth and profile of the hole, the trench and/or the opening 104 are also seriously changed.

Subsequently, referring to FIG. 1B, a slurry 300 is supplied to the polishing pad 200 so as to perform chemical mechanical polishing on the layer to be polished 102. During general chemical mechanical polishing, the slurry supplied to the polishing pad 200 contains abrasives so as to quickly and greatly remove the layer to be polished. However, if the slurry is used for polishing the layer to be polished 102 in the present embodiment, although the protrusion 106 formed at the corner of the top of the layer to be polished 102 can be removed, the thickness of the layer to be polished 102 is greatly reduced, and the depth and profile of the hole, the trench and/or the opening 104 are seriously changed. Therefore, in the present embodiment, the slurry 300 supplied to the polishing pad 200 during polishing does not contain abrasives and preferably only contains a chemical solution.

In the present embodiment, the slurry 300, for example, can be KOH, dilute hydrogen fluoride (DHF) or hydrogen peroxide ($H_2O_2$) aqueous solution. For example, when the layer to be polished 102 is a dielectric layer (such as a silicon oxide layer), the KOH or the DHF can be used as the slurry. Furthermore, when the layer to be polished 102 is a metal layer (such as a tungsten layer or a copper layer), the $H_2O_2$ aqueous solution can be used as the slurry. The present invention does not limit the type of the slurry 300. Those skilled in the art can select a suitable slurry according to the type of the layer to be polished as long as the slurry does not contain abrasives.

After the slurry 300 is supplied to the polishing pad 200, the layer to be polished 102 is directed towards the polishing pad 200, and in a moving direction perpendicular to the top surface of the layer to be polished 102 (as shown by the arrow), the fibers 204 of the polishing pad 200 are intermittently contacted with the protrusion 106. In detail, before polishing, the substrate 100 is loaded on a support member (not shown). Then, the substrate 100 is turned, the layer to be polished 102 is directed towards the polishing pad 200, and in the moving direction perpendicular to the top surface of the layer to be polished 102, the support member is continuously moved up and down so as to enable the protrusion 106 of the layer to be polished 102 to be contacted with the fibers 204. The protrusion 106 can be removed by the friction generated when the protrusion 106 contacts and leaves the fibers 204 and by the chemical reaction of the slurry 300 with the material of the protrusion 106.

Then, referring to FIG. 1C, the support member and the substrate 100 and the layer to be polished 102 thereon are removed from the polishing pad 200, and the substrate 100 is unloaded from the support member so as to complete the chemical mechanical polishing process of the present invention. At this time, the protrusion 106 is completely removed from the corner of the top of the hole, the trench and/or the opening 104.

In the present embodiment, since the diameter of each fiber 204 is less than the width of the hole, the trench and/or the opening 104 and each fiber 204 cannot be contacted with the substrate 100 exposed from the hole, the trench and/or the opening 104, the fibers 204 can enter the hole, the trench and/or the opening 104 to effectively remove the protrusion 106 formed at the corner of the top, the substrate 100 exposed from the hole, the trench and/or the opening 104 cannot be damaged, and then, the depth and profile of the hole, the trench and/or the opening 104 cannot be changed. Furthermore, as the slurry 300 does not contain abrasives, the thickness of the layer to be polished 102 cannot be greatly reduced, and the depth and profile of the hole, the trench and/or the opening 104 cannot be changed.

Although the present invention is disclosed with reference to embodiments above, the embodiments are not intended to limit the present invention. Any person of ordinary skill in the art may make some variations and modifications without departing from the spirit and scope of the invention, and therefore, the protection scope of the present invention should be defined in the following claims.

What is claimed is:

1. A chemical mechanical polishing process, comprising the following steps:
   a layer to be polished is provided, wherein the layer to be polished has a hole, a trench and/or an opening formed therein, and a protrusion is formed at the corner of the top of the hole, the trench and/or the opening;
   a polishing pad with a plurality of fibers on the surface thereof is provided; and
   in a moving direction perpendicular to the top surface of the layer to be polished, the layer to be polished is continuously moved up and down, such that the plurality of fibers of the polishing pad are intermittently contacted with the protrusion in the presence of an abrasive-free slurry.

2. The chemical mechanical polishing process according to claim 1, wherein the diameter of each of the plurality of fibers does not exceed a half of the width of the hole, the trench and/or the opening.

3. The chemical mechanical polishing process according to claim 1, wherein the length of each of the plurality of fibers does not exceed 90% of the depth of the hole, the trench and/or the opening.

4. The chemical mechanical polishing process according to claim 1, wherein the abrasive-free slurry comprises KOH, dilute hydrogen fluoride (DHF) or hydrogen peroxide ($H_2O_2$) aqueous solution.

5. The chemical mechanical polishing process according to claim 1, wherein the layer to be polished comprises a dielectric layer or a conductive layer formed on a substrate.

* * * * *